United States Patent [19]

Main

[11] Patent Number: 4,644,295
[45] Date of Patent: Feb. 17, 1987

[54] BALANCED DIFFERENTIAL LOAD AND METHOD

[75] Inventor: W. Eric Main, Mesa, Ark.

[73] Assignee: Motorola, Inc., Schaumburg, Ill.

[21] Appl. No.: 826,034

[22] Filed: Feb. 4, 1986

[51] Int. Cl.⁴ .............................................. H03F 3/45
[52] U.S. Cl. .................................... 330/301; 330/257; 330/302
[58] Field of Search ................. 330/69, 257, 275, 301, 330/302; 329/103, 110, 124; 477/214, 215

[56] References Cited

U.S. PATENT DOCUMENTS 3,866,125  2/1975  Kilian .............................. 455/214 X
4,216,435  8/1980  Ahmed ............................ 330/301 X

OTHER PUBLICATIONS

Jaeger, "Active Load for Differential Amplifiers", *IBM Technical Disclosure Bulletin* Vol. 16, No. 10, Mar. 1974, pp. 3140, 3141.

*Primary Examiner*—James B. Mullins
*Attorney, Agent, or Firm*—Michael D. Bingham

[57] ABSTRACT

An active differential load circuit which receives a differential input signal applied to first and second inputs thereof and produces a single ended output signal at an output thereof while unwanted higher frequency signals applied thereto are filtered from the output without ground currents. The load includes a pair of transistors which have, in the preferred embodiment, their collectors connected together via series connected first and second resistors with the interconnection between the two resistors being connected to the bases of the two transistors. The collectors are also respectively coupled to a pair of current sources and the respective emitters receiving the applied differential input signal. A filter capacitor is coupled between the collectors of the two transistors and efffectively shorts the unwanted higher frequency signals thereacross.

4 Claims, 4 Drawing Figures

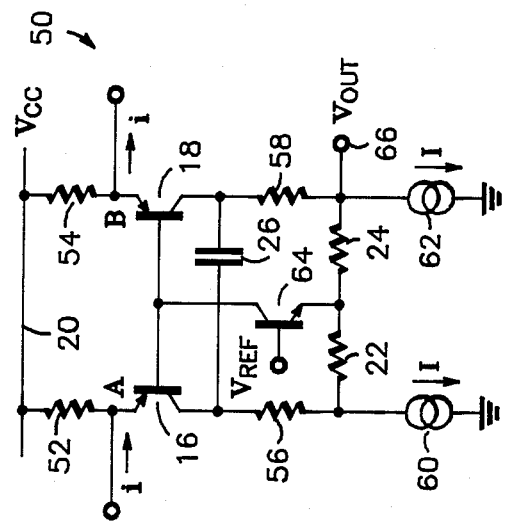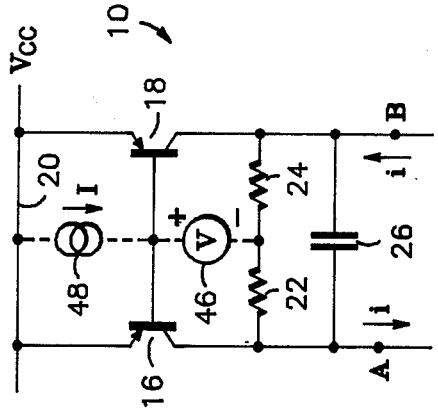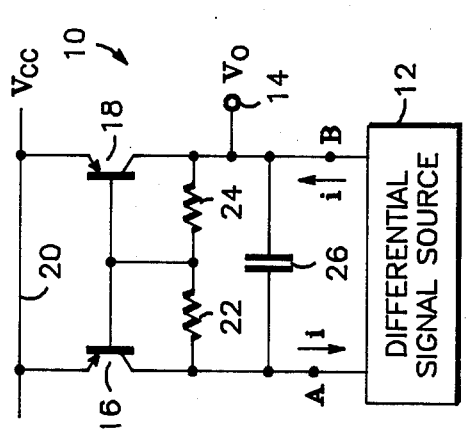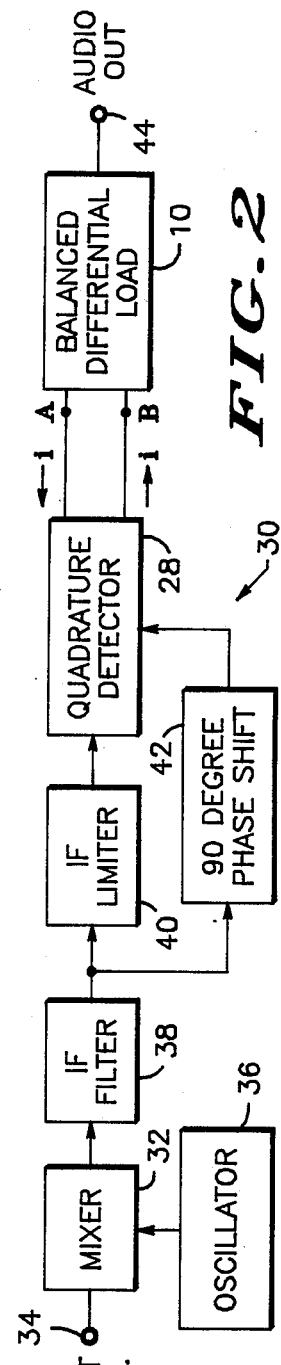

BALANCED DIFFERENTIAL LOAD AND METHOD

BACKGROUND OF THE INVENTION

The present invention relates to active electronic load circuits for receiving differential input signals and, more particularly, to a balanced differential load for providing a single ended ouput signal in response to a differential input signal applied thereto and a method for filtering unwanted frequency signals at the output thereof.

Many integrated circuits (IC's) such as mixers, detectors and low power FM receivers require filtering and differential to single ended signal conversion. For example, the MC3359 is a low power FM-IF receiver, manufacturerd by Motorola Inc., which provides FM-IF to audio signal translation that requires filtering of unwanted high frequency signals from the single ended audio output signal.

A problem can arise in prior art receivers such as the MC3359 due to the fact that the differential FM-IF signal is converted to the single ended audio output signal within the IC and because the higher unwanted frequency signals are filtered to ground. The filtering of the IF signal, as well as any other unwanted higher frequency signal, is provided by a filtering capacitor, either internal or external to the IC, that has one electrode thereof connected to ground. It has been observed that the unwanted signals which are shorted to ground through the capacitor can be injected or fedback to intermediate stages of the receiver to be amplified. This can cause oscillations to occur at the output and/or degradation of the output signal: both conditions of which are highly undesirable.

Hence, a need exists for a balanced differential load that can be used in an IC to provide amplification and differential to single ended output of a desired output signal while filtering unwanted higher frequency signals without producing ground currents due to the filtering.

SUMMARY OF THE INVENTION

Accordingly, it is an object of the present invention to provide an improved balanced load.

It is another object of the invention to provide an improved balanced differential-to-single ended load that is suited to be realized in integrated circuit form.

Still another object of the present invention is to provide an improved balanced differential load which filters unwanted frequency signals without producing ground currents due to the filtering.

In accordance with the above and other objects there is provided a differential load circuit having a pair of inputs and an output which receives a differential input signal applied to the inputs and produces a output signal at the output comprising first and second transistors each having their emitter-collector conduction paths respectively coupled to the inputs and their bases interconnected, first and second resistors series connected together between the collectors of the first and second transistors with the interconnection therebetween connected to the bases of the two transistors, a capacitor connected between the collectors of the two transistors and the collector of the second transistor coupled to the output of the load circuit.

BRIEF DESCRIPTION OF THE DRAWINGS

FIG. 1 is a schematic diagram illustrating a first embodiment of the present invention;

FIG. 2 is a simplified block diagram of a FM receiver system including the balanced differential load of the present invention;

FIG. 3 is a schematic diagram illustrating another embodiment of the invention; and FIG. 4 is a schematic diagram of the preferred embodiment of the invention.

DETAILED DESCRIPTION OF THE EMBODIMENTS

Turning to FIG. 1 there is shown balanced differential load 10 of the present invention which receives a differential input signal across nodes A and B supplied from differential signal source 12. Balanced differential load 10 is suited to be manufactured in monolithic integrated circuit form as is signal source 12. Differential signal source 12 can be any of a myriad of circuits such as a mixer, detector, etc. as is understood. If, for example, signal source 12 is a quadrature detector in a FM receiver system the differential output signals, i, sourced to and from nodes A and B will be comprised of the desired audio signal information as well as higher unwanted frequency signals such as the intermediate frequency (IF) signal and higher harmonics thereof. A requirement of balanced load 10 is then to filter the unwanted frequency signals from appearing at output 14 without filtering these signals to ground reference which otherwise can cause regeneration FM receiver system. Balanced differential load 10 is comprised of a pair of PNP transistors 16 and 18 which function current sources by having their respective collector-emitter conduction paths coupled between nodes A and B, the inputs to the active load, and power supply conductor 20 to which is supplied the DC operating potential, $V_{cc}$. The bases of transistors 16 and 18 are interconnected together to the interconnection between resistors 22 and 24. Resistor 22 in turn is returned to the collector of transistor 16 while resistor 24 is coupled to the collector of transistor 18. Filter capacitor 26 is coupled between the collectors of transistors 16 and 18.

In operation, signal source 12 will require direct current (DC) bias currents to be supplied from balanced differential load 10 through nodes A and B. These DC currents cause nodes A and B to be "pulled down" such that the voltages appearing thereat are more negative than the voltage produced at the bases of transistors 16 and 18. Hence, currents flow through resistors 22 and 24 which supply the base current drives for the two transistors. Thus, transistors 16 and 18 are turned on to source the required DC currents at nodes A and B. The DC currents are cancelled by the current source transistors and will not appear in the output signal produced at output 14. The desired alternating current (AC) output signal will flow through load resistors 22 and 24 to produce the desired output voltage at output 14 while higher unwanted frequency signals are essentially shorted through capacitor 26 and cancel each other. These differential signals due not appear on transistors 16 and 18 as their bases are interconnected whereby these transistors have equal currents flowing therethrough. Thus, all differential signals flow through resistors 22 and 24 and capacitor 26.

Therefore, for example, if balanced differential load 10 is utilized as the active load for the quadrature detector of a FM receiver system, an audio output signal is produced at the output of the load while the IF signal and other unwanted higher frequency signals are filter therefrom. Refering to FIG. 2, balanced differential load 10 is shown coupled to the output of quadrature detector 28 of FM receiver system 30. Except for load 10, FM receiver system 30 is conventional in nature and includes mixer 32 which receives the FM input signal at input 34. Oscillator 36 in combination with mixer 32 converts the FM signal to an intermediate frequency (IF). A bandpass filter 38 is provided to pass only the IF signal therethrough to both IF limiter stage 40 and ninety (90) degree phase shifter 42. The phase of the FM IF signal is shifted ninety degrees by phase shifter 42 and applied as one input signal to quadrature detector 28. The IF signal is also amplified and symmetrically clipped by limiter stage 40 to provide a rectangular output signal that is applied to the other inputs of quadrature detector 28. Quadrature detector 28 translates the IF-FM signal to an audio signal that is applied across balanced differential load 10 and supplied at output 44. The IF signal as well as higher unwanted frequency signals appearing across nodes A and B of load 10 are cancelled thereby as aforedescribed and do not appear at output 44.

Turning now to FIG. 3 there are shown alternate embodiments of balanced differential load 10 of the present invention. In order that larger amplitude input signals can be applied across nodes A and B without saturating transistors 16 and 18 the DC voltages appearing at nodes A and B may need to be down level shifted to a more negative value with respect to the bases of transistors 16 and 18. FIG. 3 illustrates methods for providing these voltage level shifting requirements. As indicated by the use of dashed lines, alternate embodiments are illustrated, the first of which comprises voltage source 46 coupled between the interconnected bases of transistors 16 and 18 and the interconnection of resistors 22 and 24. The second embodiment utilizes current source 48 coupled between power supply rail 20 and the bases of transistors 16 and 18.

In the first alternate embodiment, voltage source 46, which may be realized by a diode or a string of diodes for instance, produces a voltage drop between the bases of transistors 16 and 18 and resistors 22 and 24. Hence, the voltage produced at nodes A and B is lowered in direct proportion to the value of the voltage, V, of voltage source 46 with respect to the voltage produced at the bases of the transistors. In the second alternate embodiment current source 48 sources a current, I, directly to the interconnected resistors 22 and 24 via a direct connection as, for example, shown in FIG. 1 to produce a voltage drop thereacross. If, for example, I is equal to 200 microamperes and resistors 22 and 24 each are 10 thousand Ohms, a voltage equal to 1 volt is developed thereacross respectively. Thus, the voltage produced at nodes A and B will be approximately equal to 1.7 volts below the power supply voltage $V_{cc}$. It is understood from the foregoing description that voltage source 46 and current source 48 could be used in combination to provide voltage level shifting.

Referring now to FIG. 4, there is illustrated the preferred embodiment of the present invention. Balanced differential load 50 operates in substantially the same manner as previously described in reference to balanced differential load 10. Load 50 includes resistors 52 and 54 connected respectively between power supply conductor 20 and the emitters of transistors 16 and 18. The differential input signals are supplied across the emitters of these two transistors. The collectors of the two PNP transistors are coupled via respective resistors 56 and 58 to current sources 60 and 62. Resistors 22 and 24 are series connected between the current sources 60 and 62. A voltage level shifting transistor 64 has its collector-emitter conduction path coupled between the bases of transistors 16 and 18 to the interconnection of resistors 22 and 24 and its base connected to a voltage reference source, $V_{REF}$. Transistor 64 provides level shifting in the same manner as previously described with respect to voltage source 46 of FIG. 3.

The desired differentially applied input signal is developed across resistors 22, 24, 56 and 58 to produce the output signal $V_{out}$ at output 66. The undesired higher frequency signals are shorted across filter capacitor 26 as described above and do not appear at the output of balanced differential load 50. Resistors 56 and 58 increase the total filter resistance such that there is more voltage swing produced across capacitor 26. This effectively increases the filtering capabilities of balanced differential load 50 over balanced differential load 10.

Hence, what has been described above are novel balanced differential active loads which filter unwanted higher frequency signals from the applied differential signal inputted thereto without ground currents being introduced.

I claim:

1. A balanced differential load which receives a differential input signal applied to a pair of inputs thereof for providing an output signal at an output while filtering unwanted frequency signals from the input signal, comprising:
   first and second transistors each having an emitter, a collector and a base, said bases being coupled together and the differential input signal being applied across the respective emitters;
   circuit means for coupling said emitters of said first and second transistors to a power supply conductor to which is supplied a direct current operating potential;
   capacitive means coupled between said collectors of said first and second transistors for filtering the undesired frequency signals without producing ground currents therethrough;
   first and second resistors coupled at their distal ends between said collectors of said first and second transistors and being series connected, the output of the circuit being coupled to said distal end of said first resistor;
   current supply means coupled to said distal ends of said first and second resistors for sinking first and second substantially equal direct currents; and
   a third transistor the collector-emitter conduction path of which is coupled between said interconnected bases of said first and second transistors and the interconnection of said series connected first and second resistors, the base of said third transistor receiving a reference potential supplied thereto which sets the direct current voltage level at the output of the load.

2. The balanced differential load of claim 1 including:
   a third resistor coupled between said collector of said first transistor and the output of the load; and
   a fourth resistor coupled between said collector of said second transistor and said distal end of said second resistor.

3. The balanced differential load of claim 2 including:

a fifth resistor coupled between said power supply conductor and said emitter of said first transistor; and a sixth resistor coupled between said power supply conductor and said emitter of said second transistor.

4. The balanced differential load of claim 3 wherein said current supply means includes;

a first current source coupled to said distal end of said first resistor; and a second current source coupled to said distal end of said second resistor.

* * * * *